United States Patent
Choi et al.

(10) Patent No.: US 12,412,604 B2
(45) Date of Patent: Sep. 9, 2025

(54) NONVOLATILE SEMICONDUCTOR MEMORY DEVICE INCLUDING A DATA STORING CAPACITOR IN EACH PAGE BUFFER

(71) Applicant: SK hynix Inc., Icheon-si Gyeonggi-do (KR)

(72) Inventors: Won Jae Choi, Icheon-si Gyeonggi-do (KR); Jeong Hwan Kim, Icheon-si Gyeonggi-do (KR); Moon Soo Sung, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 179 days.

(21) Appl. No.: 18/074,280

(22) Filed: Dec. 2, 2022

(65) Prior Publication Data

US 2024/0013821 A1 Jan. 11, 2024

(30) Foreign Application Priority Data

Jul. 8, 2022 (KR) .......................... 10-2022-0084128

(51) Int. Cl.
*G11C 7/10* (2006.01)
*G11C 7/12* (2006.01)

(52) U.S. Cl.
CPC .......... *G11C 7/1096* (2013.01); *G11C 7/1039* (2013.01); *G11C 7/1069* (2013.01); *G11C 7/12* (2013.01)

(58) Field of Classification Search
None
See application file for complete search history.

(56) References Cited

U.S. PATENT DOCUMENTS

| | | | | |
|---|---|---|---|---|
| 8,243,528 B2 * | 8/2012 | Kwon | .................... | G11C 16/16 365/185.21 |
| 2002/0126531 A1 * | 9/2002 | Hosono | .................. | G11C 16/26 365/185.17 |
| 2006/0209601 A1 * | 9/2006 | Kim | ....................... | G11C 16/24 365/189.05 |
| 2008/0212370 A1 * | 9/2008 | Tokiwa | .................. | G11C 16/06 365/185.09 |
| 2010/0097855 A1 * | 4/2010 | Bayle | ................. | G11C 16/0483 365/185.24 |

(Continued)

FOREIGN PATENT DOCUMENTS

| KR | 1020190057800 A | 5/2019 |
|---|---|---|
| KR | 102254158 B1 | 5/2021 |
| KR | 1020210119509 A | 10/2021 |

*Primary Examiner* — Richard Elms
*Assistant Examiner* — Elizabeth Agger
(74) *Attorney, Agent, or Firm* — WILLIAM PARK AND ASSOCIATES LTD.

(57) ABSTRACT

Provided herein may be a nonvolatile semiconductor memory device. The nonvolatile semiconductor memory device may include a memory cell array, a read and write circuit, and a control logic. The memory cell array may include a plurality of nonvolatile memory cells. The read and write circuit may be configured to perform a program operation or a read operation on nonvolatile memory cells that are selected from among the plurality of nonvolatile memory cells. The control logic may be configured to control an operation of the read and write circuit. The read and write circuit may include at least one capacitor configured to store bit data.

14 Claims, 11 Drawing Sheets

(56) References Cited

U.S. PATENT DOCUMENTS

| | | | |
|---|---|---|---|
| 2013/0083607 A1* | 4/2013 | Joo | G11C 16/08 |
| | | | 365/185.21 |
| 2014/0036597 A1* | 2/2014 | Nakayama | G11C 16/26 |
| | | | 365/185.21 |
| 2019/0156899 A1* | 5/2019 | Yamauchi | G11C 7/106 |
| 2023/0168820 A1* | 6/2023 | Wan | G06F 3/0626 |
| | | | 711/103 |

* cited by examiner

NONVOLATILE SEMICONDUCTOR MEMORY DEVICE INCLUDING A DATA STORING CAPACITOR IN EACH PAGE BUFFER

CROSS-REFERENCE TO RELATED APPLICATION

The present application claims priority under 35 U.S.C. § 119(a) to Korean patent application number 10-2022-0084128, filed on Jul. 8, 2022, in the Korean Intellectual Property Office, the entire disclosure of which is incorporated herein by reference.

BACKGROUND

1. Technical Field

Various embodiments of the present disclosure relate to a nonvolatile semiconductor memory device, and more particularly to a nonvolatile semiconductor memory device in which an area occupied by a read and write circuit is reduced.

2. Related Art

A semiconductor memory device may have a two-dimensional (2D) structure in which strings are horizontally arranged on a semiconductor substrate. Alternatively, the semiconductor memory device may have a three-dimensional (3D) structure in which strings are vertically stacked on a semiconductor substrate. As a memory device having a 2D structure is reaching its physical scaling limit (i.e., limit in the degree of integration), a 3D memory device including a plurality of memory cells vertically stacked on a semiconductor substrate has been produced. A nonvolatile semiconductor memory device is configured such that a plurality of memory cells are implemented as nonvolatile memory cells.

SUMMARY

An embodiment of the present disclosure may provide for a nonvolatile semiconductor memory device. The nonvolatile semiconductor memory device may include a memory cell array, a read and write circuit, and a control logic. The memory cell array may include a plurality of nonvolatile memory cells. The read and write circuit may be configured to perform a program operation or a read operation on nonvolatile memory cells that are selected from among the plurality of nonvolatile memory cells. The control logic may be configured to control an operation of the read and write circuit. The read and write circuit may include at least one capacitor configured to store bit data.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms, and should not be construed as being limited to the embodiments described in the specification or application.

Various embodiments of the present disclosure are directed to a nonvolatile semiconductor memory device in which an area occupied by a read and write circuit is reduced.

Figure 1:
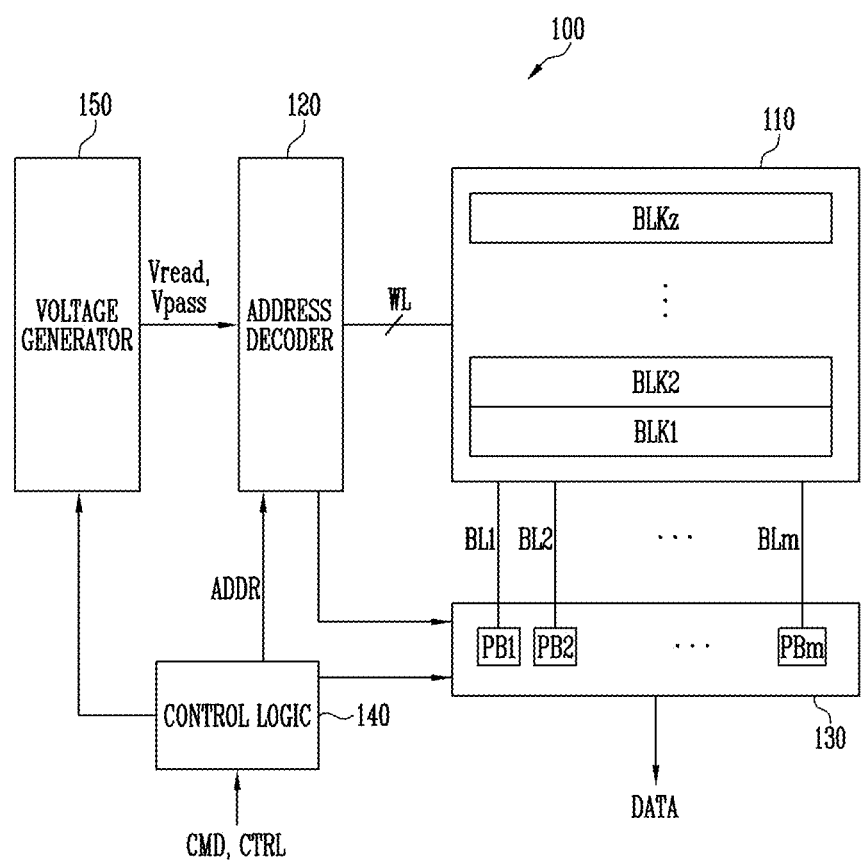
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, a semiconductor memory device 100 may include a memory cell array 110, an address decoder 120, a read and write circuit 130, a control logic 140, and a voltage generator 150.

The memory cell array 110 may include a plurality of memory blocks BLK1 to BLKz. The memory blocks BLK1 to BLKz are coupled to the address decoder 120 through word lines WL. The memory blocks BLK1 to BLKz are coupled to the read and write circuit 130 through bit lines BL1 to BLm. Each of the memory blocks BLK1 to BLKz includes a plurality of memory cells. In an embodiment, the plurality of memory cells may be nonvolatile memory cells and may be implemented as nonvolatile memory cells having a vertical channel structure. The memory cell array 110 may be implemented as a memory cell array having a two-dimensional (2D) structure. In an embodiment, the memory cell array 110 may be implemented as a memory cell array having a three-dimensional (3D) structure.

Each of the memory cells included in the memory cell array may store at least one bit of data. In an embodiment, each of the memory cells included in the memory cell array 110 may be a single-level cell (SLC) that stores 1-bit data. In an embodiment, each of the memory cells included in the memory cell array 110 may be a multi-level cell (MLC) that stores 2-bit data. In an embodiment, each of the plurality of memory cells included in the memory cell array 110 may be a memory cell that stores 3 or more bits of data.

In an embodiment, each of the memory cells included in the memory cell array may be a nonvolatile memory cell. When the plurality of memory cells included in the memory cell array are implemented as nonvolatile memory cells, data that is stored in the memory cells may be retained even when the supply of power to the semiconductor memory device 100 is interrupted.

The address decoder 120, the read and write circuit 130, and the control logic 140 function as a peripheral circuit for driving the memory cell array 110. The address decoder 120 may be coupled to the memory cell array 110 through the word lines WL. The address decoder 120 may be operated under the control of the control logic 140. The address decoder 120 may receive addresses ADDR. The addresses ADDR may include a block address, a column address, a row address, etc.

The address decoder 120 may decode the block address, among the received addresses. The address decoder 120 may select at least one memory block according to the decoded block address. When a read voltage application operation is performed during a read operation, the address decoder 120 may apply a read voltage Vread, generated by the voltage generator 150, to a selected word line of a selected memory block and may apply a pass voltage Vpass to the remaining word lines, that is, unselected word lines. Further, during a program verify operation, the address decoder 120 may apply a verify voltage, generated by the voltage generator 150, to the selected word line of the selected memory block and may apply the pass voltage Vpass to the remaining word lines, that is, unselected word lines.

The address decoder 120 may decode the column address, among the received addresses. The address decoder 120 may transmit the decoded column address to the read and write circuit 130.

Each of the read and program operations of the semiconductor memory device 100 may be performed on a page basis. Addresses received in response to requests for the read and program operations may include a block address, a row address, and a column address. The address decoder 120 may select one memory block and one word line in accordance with the block address and the row address. The column address may be decoded by the address decoder 120 and may then be provided to the read and write circuit 130.

The address decoder 120 may include a block decoder, a row decoder, a column decoder, an address buffer, etc.

The read and write circuit 130 may include a plurality of page buffers PB1 to PBm. The read and write circuit 130 may be operated as a "read circuit" during a read operation on the memory cell array 110 and as a "write circuit" during a write operation. The plurality of page buffers PB1 to PBm may be coupled to the memory cell array 110 through the bit lines BL1 to BLm. In order to sense threshold voltages of the memory cells during a read operation and a program verify operation, each of the page buffers PB1 to PBm may sense, through a sensing node, a change in the amount of current that is flowing based on the program state of a corresponding memory cell and latch the sensed change as sensing data while continuously supplying a sensing current to the bit lines that are coupled to the memory cells. The read and write circuit 130 may be operated in response to page buffer control signals that are output from the control logic 140.

During a read operation, the read and write circuit 130 may sense data in the memory cells and temporarily store read-out data, and the read and write circuit 130 may then output data DATA to the input/output buffer (not shown) of the semiconductor memory device 100. In an embodiment, the read and write circuit 130 may include a column select circuit or the like as well as the page buffers (or page registers).

The control logic 140 may be coupled to the address decoder 120, the read and write circuit 130, and the voltage generator 150. The control logic 140 may receive a command CMD and a control signal CTRL through the input/output buffer (not illustrated) of the semiconductor memory device 100. The control logic 140 may control the overall operation of the semiconductor memory device 100 in response to the control signal CTRL. Furthermore, the control logic 140 may output a control signal for controlling a precharge potential level at the sensing node of the plurality of page buffers PB1 to PBm. The control logic 140 may control the read and write circuit 130 to perform a read operation on the memory cell array 110.

Figure 2:
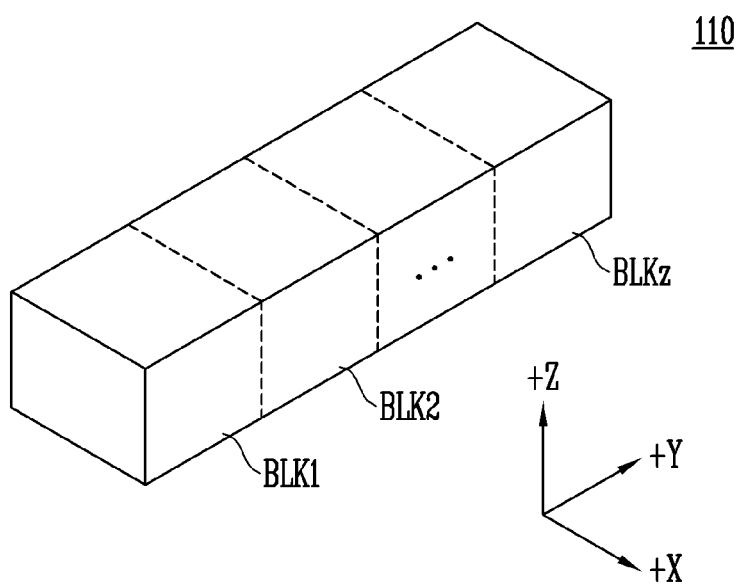
FIG. 2 is a diagram illustrating an embodiment of a memory cell array of FIG. 1.

FIG. 2 is a diagram illustrating an embodiment of the memory cell array of FIG. 1.

Referring to FIG. 2, the memory cell array 110 may include a plurality of memory blocks BLK1 to BLKz. Each of the memory blocks may have a three-dimensional (3D) structure. Each of the memory blocks may include a plurality of memory cells that are stacked on a substrate. The plurality of memory cells may be arranged in +X, +Y, and +Z directions. The structure of each memory block will be described in greater detail below with reference to FIG. 3.

Figure 3:
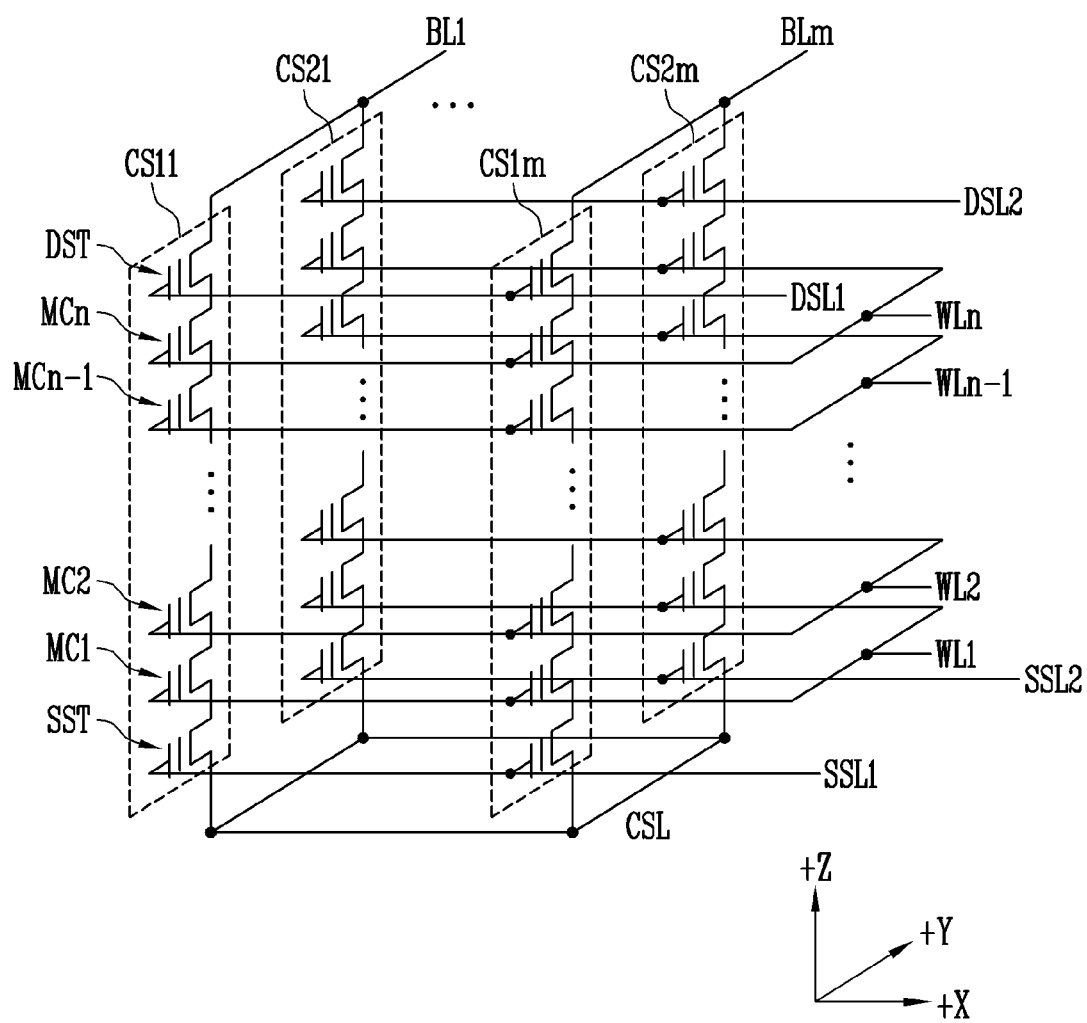
FIG. 3 is a circuit diagram illustrating any one memory block BLKa of memory blocks BLK1 to BLKz of FIG. 2.

FIG. 3 is a circuit diagram illustrating any one memory block BLKa of memory blocks BLK1 to BLKz of FIG. 2.

Referring to FIG. 3, the memory block BLKa may include a plurality of cell strings CS11 to CS1$m$ and CS21 to CS2$m$. In the memory block BLKa, m cell strings may be arranged in a row direction (i.e., a positive (+) X direction). In FIG. 3, two cell strings are illustrated as being arranged in a column direction (i.e., a positive (+) Y direction). However, this illustration is made for convenience of description, and it will be understood that three or more cell strings may be arranged in the column direction.

Each of the plurality of cell strings CS11 to CS1$m$ and CS21 to CS2$m$ may include at least one source select transistor SST, first to n-th memory cells MC1 to MCn, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST in each cell string may be coupled between a common source line CSL and the memory cells MC1 to MCn.

In an embodiment, the source select transistors of cell strings that are arranged in the same row may be coupled to a source select line extending in a row direction, and the source select transistors of cell strings that are arranged in different rows may be coupled to different source select lines. In FIG. 3, the source select transistors of the cell strings CS11 to CS1$m$ in a first row may be coupled to a first source select line SSL1. The source select transistors of the cell strings CS21 to CS2$m$ in a second row may be coupled to a second source select line SSL2.

In an embodiment, the source select transistors of the cell strings CS11 to CS1m and CS21 to CS2m may be coupled in common to one source select line.

The first to n-th memory cells MC1 to MCn in each cell string may be coupled between the source select transistor SST and the drain select transistor DST.

Gates of the first to n-th memory cells MC1 to MCn in each cell string may be coupled to first to n-th word lines WL1 to WLn, respectively.

The drain select transistor DST in each cell string may be coupled between the corresponding bit line and the memory cells MC1 to MCn. The drain select transistors DST of cell strings that are arranged in the row direction may be coupled to a drain select line extending in the row direction. The drain select transistors of the cell strings CS11 to CS1m in the first row may be coupled to a first drain select line DSL1. The drain select transistors of the cell strings CS21 to CS2m in the second row may be coupled to a second drain select line DSL2.

Cell strings that are arranged in the column direction may be coupled to bit lines extending in the column direction. In FIG. 3, the cell strings CS11 and CS21 in a first column may be coupled to a first bit line BL1. The cell strings CS1m and CS2m in an m-th column may be coupled to an m-th bit line BLm.

Memory cells that are coupled to the same word line in cell strings that are arranged in the row direction may form one page. For example, memory cells that are coupled to the first word line WL1, among the cell strings CS11 to CS1m in the first row, may form one page. Memory cells that are coupled to the first word line WL1, among the cell strings CS21 to CS2m in the second row, may form one additional page. Cell strings that are arranged in the direction of one row may be selected by selecting any one of the drain select lines DSL1 and DSL2. One page may be selected from the selected cell strings by selecting any one of the word lines WL1 to WLn.

In an embodiment, instead of the first to m-th bit lines BL1 to BLm, even bit lines and odd bit lines may be provided. Even-numbered cell strings, among the cell strings CS11 to CS1m or CS21 to CS2m arranged in a row direction, may be coupled to respective even bit lines. Odd-numbered cell strings, among the cell strings CS11 to CS1m or CS21 to CS2m arranged in the row direction, may be coupled to respective odd bit lines.

In an embodiment, one or more of first to n-th memory cells MC1 to MCn may be used as dummy memory cells. For example, the one or more dummy memory cells may be provided to reduce an electric field between the source select transistor SST and the memory cells MC1 to MCn. Alternatively, the one or more dummy memory cells may be provided to reduce an electric field between the drain select transistor DST and the memory cells MC1 to MCn. As the number of dummy memory cells that are provided is increased, the reliability of operation of the memory block BLKa may be improved, whereas the size, that is, physical dimension, of the memory block BLKa may be increased. As the number of dummy memory cells that are provided is decreased, the size, that is, physical dimension, of the memory block BLKa may be decreased, whereas the reliability of operation of the memory block BLKa may be deteriorated.

Referring to FIG. 3, each of the plurality of cell strings CS11 to CS1m and CS21 to CS2m may be formed in an "I" shape between the bit lines BL1 to BLm and the common source line CSL. However, this is only an example, and memory blocks having other shapes may also be implemented. For example, each of the plurality of cell strings included in the memory block may be formed in a 'U' shape. In this case, each cell string may include a pipe transistor. Also, memory cells in a first group, among the memory cells included in respective cell strings, may be coupled in series between the source select transistor and the pipe transistor. That is, the memory cells in the first group and memory cells in a second group may be coupled to each other through pipe transistors. Meanwhile, the memory cells in the first group, among the memory cells included in respective cell strings, may be coupled in series between the pipe transistor and the drain select transistor. A gate of the pipe transistor in each cell string may be coupled to a pipeline.

Figure 4:
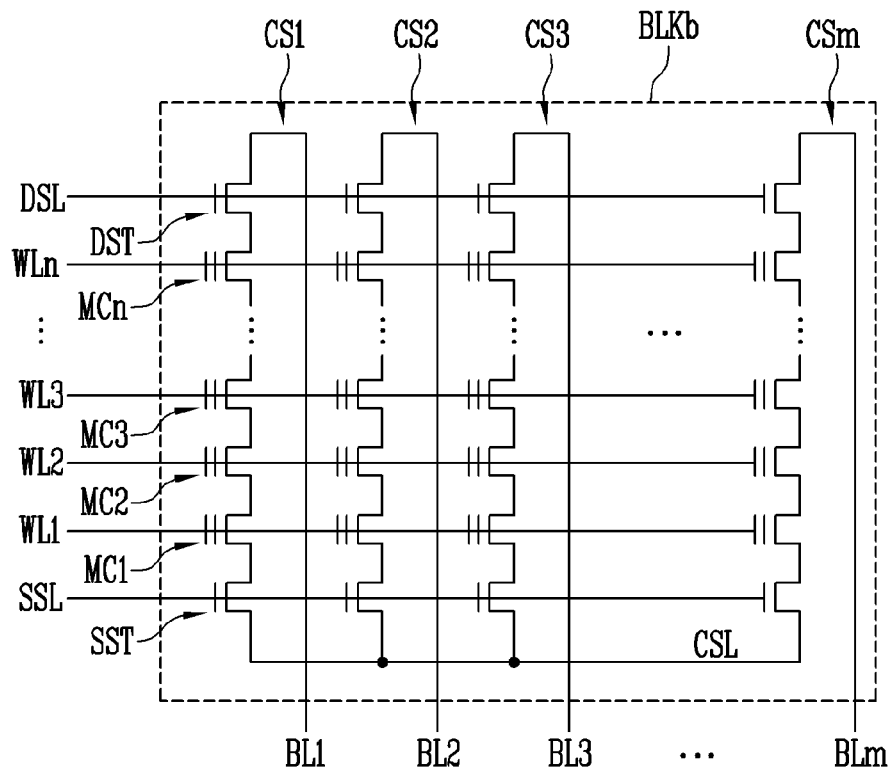
FIG. 4 is a circuit diagram illustrating an example of any one memory block BLKb of the memory blocks BLK1 to BLKz included in the memory cell array 110 of FIG. 1.

FIG. 4 is a circuit diagram illustrating an example of any one memory block BLKb of the memory blocks BLK1 to BLKz included in the memory cell array 110 of FIG. 1.

Referring to FIG. 4, the memory block BLKb may include a plurality of cell strings CS1 to CSm. The plurality of cell strings CS1 to CSm may be coupled to a plurality of bit lines BL1 to BLm, respectively. Each of the cell strings CS1 to CSm may include at least one source select transistor SST, first to n-th memory cells MC1 to MCn, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST in each cell string may be coupled between a common source line CSL and the memory cells MC1 to MCn.

The first to n-th memory cells MC1 to MCn in each cell string may be coupled between the source select transistor SST and the drain select transistor DST.

The drain select transistor DST in each cell string may be coupled between the corresponding bit line and the memory cells MC1 to MCn.

The memory cells that are coupled to the same word line may constitute a single page. The cell strings CS1 to CSm may be selected by selecting the drain select line DSL. One page may be selected from the selected cell strings by selecting any one of the word lines WL1 to WLn.

In an embodiment, instead of the first to m-th bit lines BL1 to BLm, even bit lines and odd bit lines may be provided. Among the cell strings CS1 to CSm, even-numbered cell strings may be coupled to the even bit lines, respectively, and odd-numbered cell strings may be coupled to the odd bit lines, respectively.

Figure 5:
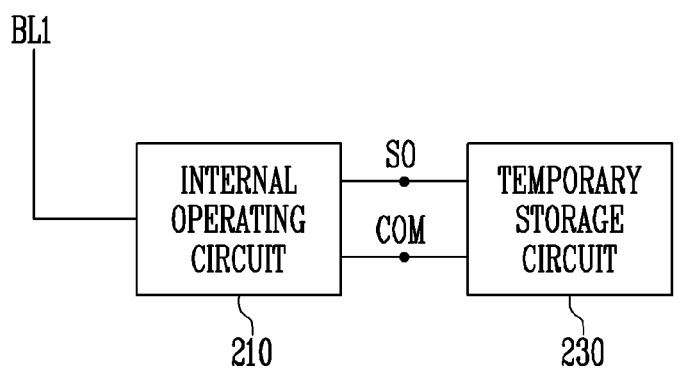
FIG. 5 is a block diagram illustrating an embodiment of a page buffer PB1 of FIG. 1.

FIG. 5 is a block diagram illustrating an embodiment of a page buffer PB1 of FIG. 1.

The page buffer, illustrated in FIG. 5, may be the first page buffer PB1, among the page buffers PB1 to PBm included in the read and write circuit 130 of FIG. 1. Because the plurality of page buffers PB1 to PBm included in the read and write circuit 130 may be configured in a similar manner, any one of the page buffers is described by way of example.

The page buffer PB1 may include an internal operating circuit 210 that is coupled to a bit line BL1, and a temporary storage circuit 230 that is coupled to the internal operating circuit 210 through a sensing node SO and a comparison node COM. The internal operating circuit 210 may control the voltage of the bit line during an operation on a memory cell array. In detail, during a program operation, the internal operating circuit 210 may program a memory cell that is coupled to the bit line BL1 by controlling the voltage of the bit line BL1. Further, during a read operation, the internal operating circuit 210 may read data that is stored in the memory cell that is coupled to the bit line BL1 by controlling the voltage of the bit line BL1. An embodiment of the internal operating circuit 210 will be described in detail later with reference to FIG. 6.

The temporary storage circuit 230 may temporarily store bit data. In detail, during a program operation that is performed on the memory cell that is coupled to the bit line BL1, the temporary storage circuit 230 may temporarily store bit data to be stored in the memory cell that is coupled to the bit line BL1. Also, the temporary storage circuit 230 may store, as bit data, the result of verification on the memory cell that is coupled to the bit line BL1.

Meanwhile, during a read operation on the memory cell that is coupled to the bit line BL1, the temporary storage circuit 230 may store, as bit data, the result of sensing a threshold voltage by using at least one read voltage. In other words, the temporary storage circuit may store bit data indicating whether the threshold voltage of the memory cell that is coupled to the bit line BL1 may be higher than the read voltage.

In order to store the bit data, the temporary storage circuit 230 may include at least one bit storage element. Embodiments of the temporary storage circuit 230 will be described in detail later with reference to FIGS. 7 and 8.

Figure 6:
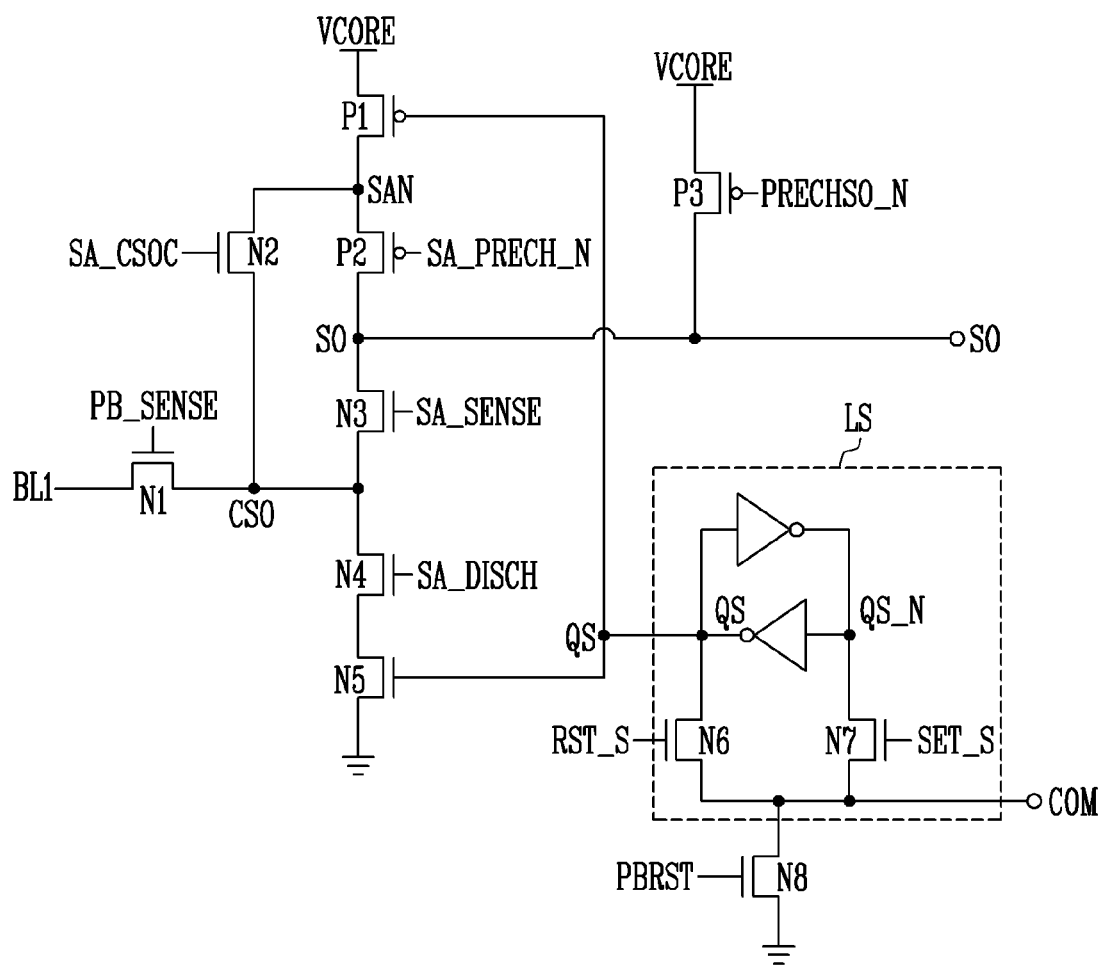
FIG. 6 is a circuit diagram illustrating an embodiment of an internal operating circuit 210 of FIG. 5.

FIG. 6 is a circuit diagram illustrating an embodiment of the internal operating circuit 210 of FIG. 5.

The internal operating circuit 210 may be operated in response to a signal that is output from a control logic 140. Signals PB_SENSE, SA_PRECH_N, SA_SENSE, SA_CSOC, SA_DISCH, PRECHSO_N, which will be described below, may be control signals that are output from the control logic 140. The internal operating circuit 210 will be described in detail below.

Referring to FIG. 6, the internal operating circuit 210 may be coupled to a memory cell through a bit line BL1 and may perform a bit line precharge operation of charging the bit line BL1 with charges, supplied from a supply voltage source VCORE through first to fifth NMOS transistors N1 to N5 and first to third PMOS transistors P1 to P3. Also, the internal operating circuit 210 may discharge the bit line BL1 that is charged with the charges to a ground voltage through the first NMOS transistor N1, the fourth NMOS transistor N4, and the fifth NMOS transistor N5.

The first NMOS transistor N1 may be coupled between the bit line BL1 and a common node CSO. The first PMOS transistor P1 may be coupled between the supply voltage source VCORE and a sense amplifier (AMP) node SAN. The second NMOS transistor N2 may be coupled between the common node CSO and the sense AMP node SAN. The second PMOS transistor P2 may be coupled between the sense AMP node SAN and a sensing node SO. The third NMOS transistor N3 may be coupled between the sensing node SO and the common node CSO. The third PMOS transistor P3 may be coupled between the supply voltage source VCORE and the sensing node SO. The fourth and fifth NMOS transistors N4 and N5 may be coupled in series between the common node CSO and a ground voltage source.

The first NMOS transistor N1 may be controlled in response to a page buffer sensing signal PB_SENSE, the second NMOS transistor N2 may be controlled in response to a current sensing signal SA_CSOC, and the third NMOS transistor N3 may be controlled in response to a sense AMP sensing signal SA_SENSE. Further, the fourth NMOS transistor N4 may be controlled in response to a sense AMP discharge signal SA_DISCH, and the fifth NMOS transistor N5 and the first PMOS transistor P1 may be controlled in response to the voltage of a node QS of a sensing latch circuit LS. The second PMOS transistor P2 may be controlled in response to a sense AMP precharge signal SA_P-RECH_N, and the third PMOS transistor P3 may be controlled in response to a sensing node precharge signal PRECHSO_N. That is, the page buffer sensing signal PB_SENSE may be applied to a gate of the first NMOS transistor N1, the current sensing signal SA_CSOC may be applied to a gate of the second NMOS transistor N2, and the sense AMP sensing signal SA_SENSE may be applied to a gate of the third NMOS transistor N3. Further, the sense AMP discharge signal SA_DISCH may be applied to a gate of the fourth NMOS transistor N4, and the voltage of the node QS of the sensing latch circuit LS may be applied to gates of the fifth NMOS transistor N5 and the first PMOS transistor P1. The sense AMP precharge signal SA_P-RECH_N may be applied to a gate of the second PMOS transistor P2, and the sensing node precharge signal PRECHSO_N may be applied to a gate of the third PMOS transistor P3.

The sensing latch circuit LS may include two inverters (not illustrated) that are coupled to the node QS, a sixth NMOS transistor N6 functioning as a reset transistor for controlling the voltage of the node QS, and a seventh NMOS transistor N7 functioning as a set transistor. In an embodiment, the sensing latch circuit LS may be implemented in an SRAM structure including six transistors. The sixth NMOS transistor N6 and the seventh NMOS transistor N7 may be controlled in response to a reset control signal RST_S and a set control signal SET_S, respectively. Meanwhile, the sixth NMOS transistor N6 and the seventh NMOS transistor N7 may be coupled to an eighth NMOS transistor N8 through a comparison node COM. The eighth NMOS transistor N8 may be controlled in response to a page buffer reset control signal PBRST and may be coupled to the ground voltage source.

Figure 7:
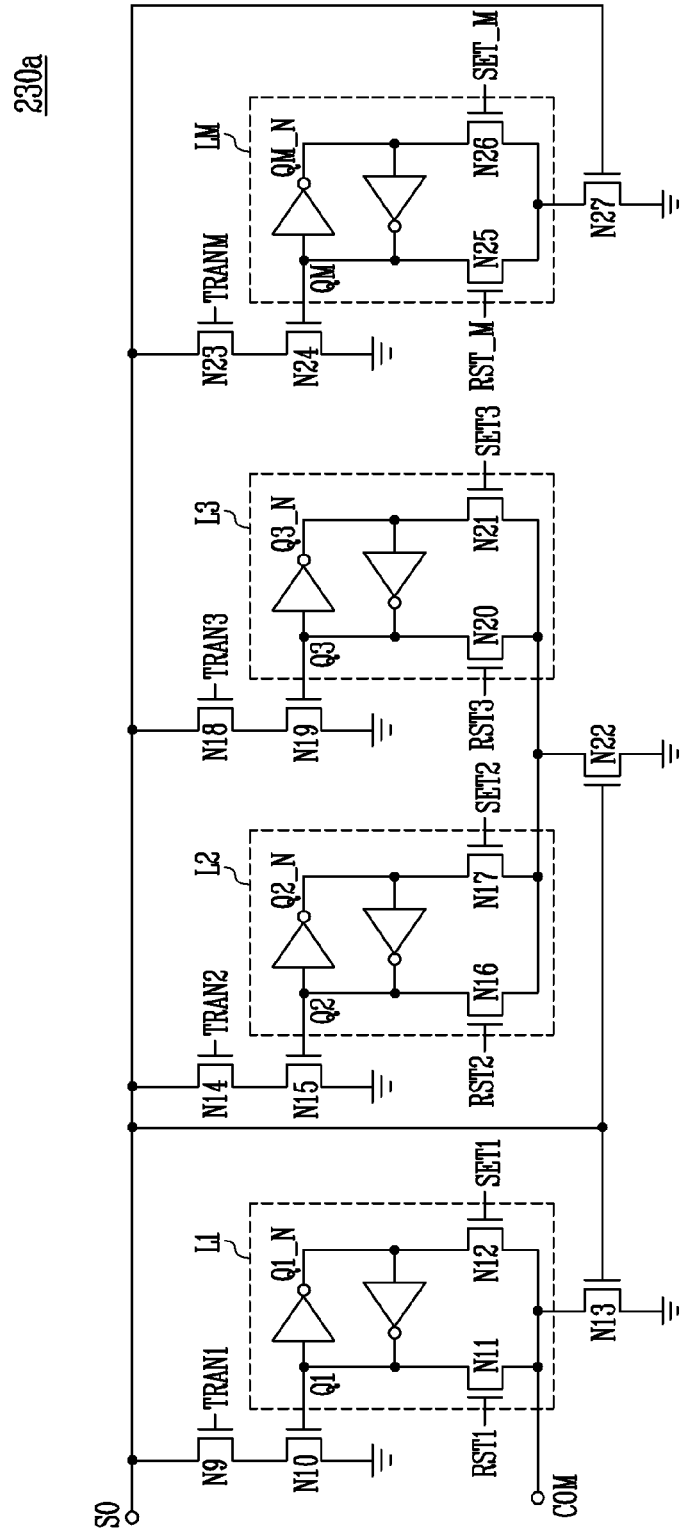
FIG. 7 is a circuit diagram illustrating an example 230*a* of a temporary storage circuit of FIG. 5.

FIG. 7 is a circuit diagram illustrating an example 230a of the temporary storage circuit of FIG. 5.

Referring to FIG. 7, the temporary storage circuit 230a may include first to third latch circuits L1, L2, and L3 and a main latch circuit LM. Bit data that is stored in the first latch circuit L1 may be used to control the operation of a tenth NMOS transistor N10. The tenth NMOS transistor N10 may be coupled to a sensing node SO through a ninth NMOS transistor N9. The ninth NMOS transistor N9 may be controlled in response to a first transfer control signal TRAN1.

Meanwhile, the first latch circuit L1 may include an eleventh NMOS transistor N11 and a twelfth NMOS transistor N12. The 11-th NMOS transistor N11 and the twelfth NMOS transistor N12 may be coupled to a comparison node COM. Also, a thirteenth NMOS transistor N13 may be coupled between the comparison node COM and a ground voltage source. The thirteenth NMOS transistor N13 may be controlled in response to the voltage of the sensing node SO.

Bit data that is stored in the second latch circuit L2 may be used to control the operation of a fifteenth NMOS transistor N15. The fifteenth NMOS transistor N15 may be coupled to the sensing node SO through a fourteenth NMOS transistor N14. The fourteenth NMOS transistor N14 may be controlled in response to a second transfer control signal TRAN2.

Meanwhile, the second latch circuit L2 may include a sixteenth NMOS transistor N16 and a seventeenth NMOS transistor N17. The sixteenth NMOS transistor N16 and the seventeenth NMOS transistor N17 may be coupled to a 22-th NMOS transistor N22. The 22-th NMOS transistor N22 may also be coupled to the ground voltage source and may be controlled in response to the voltage of the sensing node SO.

Bit data that is stored in the third latch circuit L3 may be used to control the operation of a nineteenth NMOS transistor N19. The nineteenth NMOS transistor N19 may be coupled to the sensing node SO through an eighteenth NMOS transistor N18. The eighteenth NMOS transistor N18 may be controlled in response to a third transfer control signal TRAN3.

Meanwhile, the third latch circuit L3 may include a twentieth NMOS transistor N20 and a 21-st NMOS transistor N21. The twentieth NMOS transistor N20 and the 21-st NMOS transistor N21 may be coupled to a 22-nd NMOS transistor N22.

Bit data that is stored in the main latch circuit LM may be used to control the operation of a 24-th NMOS transistor N24. The 24-th NMOS transistor N24 may be coupled to the sensing node SO through a 23-rd NMOS transistor N23. The 23-rd NMOS transistor N23 may be controlled in response to a main transfer control signal TRANM.

Meanwhile, the main latch circuit LM may include a 25-th NMOS transistor N25 and a 26-th NMOS transistor N26. The 25-th NMOS transistor N25 and the 26-th NMOS transistor N26 may be coupled to a 27-th NMOS transistor N27. The 27-th NMOS transistor N27 may also be coupled to the ground voltage source and may be controlled in response to the voltage of the sensing node SO.

The temporary storage circuit 230a illustrated in FIG. 7 may include the four latch circuits L1, L2, L3, and LM and additional transistors for controlling the latch circuits. Each of the four latch circuits L1, L2, L3, and LM, illustrated in FIG. 7, may be implemented in an SRAM structure including six transistors. Therefore, in order to implement the temporary storage circuit 230a illustrated in FIG. 7, a large number of transistors are required.

In accordance with an embodiment of the present disclosure, a DRAM may be used instead of the SRAM for the temporary storage circuit. A DRAM is a kind of volatile memory device, and data that is stored in the DRAM is lost when the supply of power to the DRAM is interrupted. When the DRAM is used to store bit data, it may be implemented by using one transistor and one capacitor. Therefore, an area required to implement the semiconductor memory device 100 may be reduced.

Figure 8:
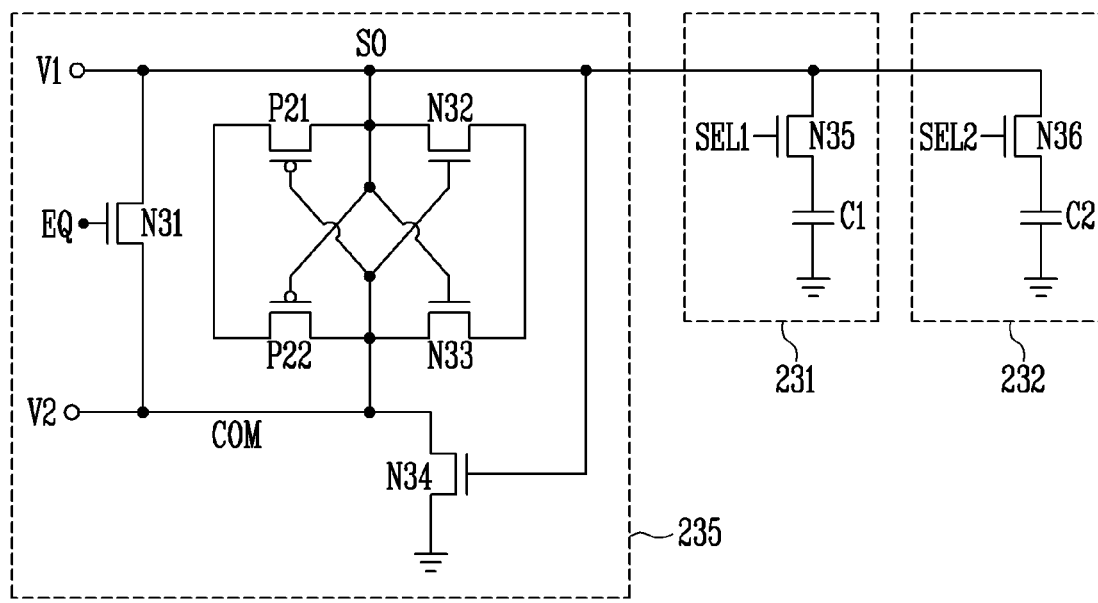
FIG. 8 is a circuit diagram illustrating an example 230*b* of the temporary storage circuit of FIG. 5.

FIG. 8 is a circuit diagram illustrating an example 230b of the temporary storage circuit of FIG. 5.

Referring to FIG. 8, the temporary storage circuit 230b may include a sense amplifier 235 and a plurality of storages 231 and 232. In FIG. 8, an embodiment in which the temporary storage circuit 230b includes two storages 231 and 232 is illustrated, but the present disclosure is not limited thereto. That is, a temporary storage circuit including a variety of numbers of storages may be implemented if necessary.

The sense amplifier 235 may include four NMOS transistors N31, N32, N33, and N34 and two PMOS transistors P21 and P22. The 34-th NMOS transistor N34 may be coupled between a comparison node COM and a ground voltage source. The 34-th NMOS transistor N34 may discharge the comparison node COM based on the voltage of the sensing node SO.

Meanwhile, the sense amplifier 235 may be coupled to the sensing node SO and the comparison node COM. Also, the sense amplifier 235 may be coupled to a first power source V1 and a second power source V2. An external voltage may be supplied through the first power source V1 and the second power source V2. Meanwhile, a control signal EQ may be transferred from the control logic 140 of FIG. 1 to the sense amplifier 235. The control signal EQ may be used to control the voltages of the sensing node SO and the comparison node COM to an equal voltage.

Each of the plurality of storages 231 and 232 included in the temporary storage circuit 230b may include an NMOS transistor N35 or N36 and a capacitor C1 or C2. That is, each of the plurality of storages 231 and 232 may be implemented in a DRAM structure.

In accordance with the structure illustrated in FIG. 8, each of the storages 231 and 232 used to store bit data includes only one transistor and one capacitor, and thus, the area required to implement a page buffer circuit may be reduced.

Figure 9A:
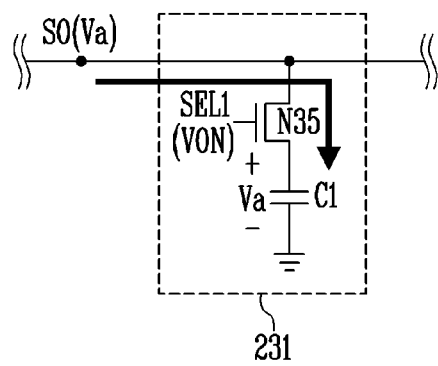
FIGS. 9A and 9B are diagrams for explaining an operation of storing bit data in a first storage 231 of FIG. 8.
Figure 9B:
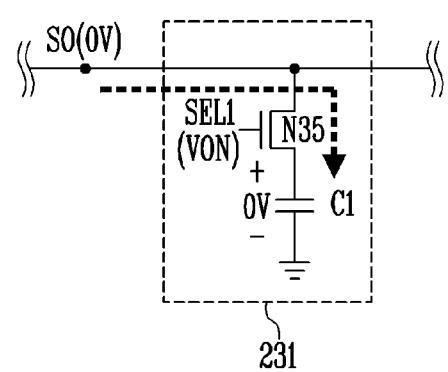

FIGS. 9A and 9B are diagrams for explaining an operation of storing bit data in the first storage 231 of FIG. 8. For convenience of description, in FIGS. 9A and 9B, illustration of the configuration except for a sensing node SO and the first storage 231 is omitted.

Referring to FIG. 9A, in the case in which the voltage of the sensing node SO is a relatively high voltage Va, when a turn-on voltage VON is applied to the gate of the 35-th transistor N35 included in the first storage 231, the first capacitor C1 included in the first storage 231 may be charged to the high voltage Va.

Referring to FIG. 9B, in the case in which the voltage of the sensing node SO is a ground voltage, that is, 0 V, when the turn-on voltage VON is applied to the gate of the 35-th transistor N35 included in the first storage 231, the first capacitor C1 included in the first storage 231 may be discharged to 0 V.

Figure 10A:
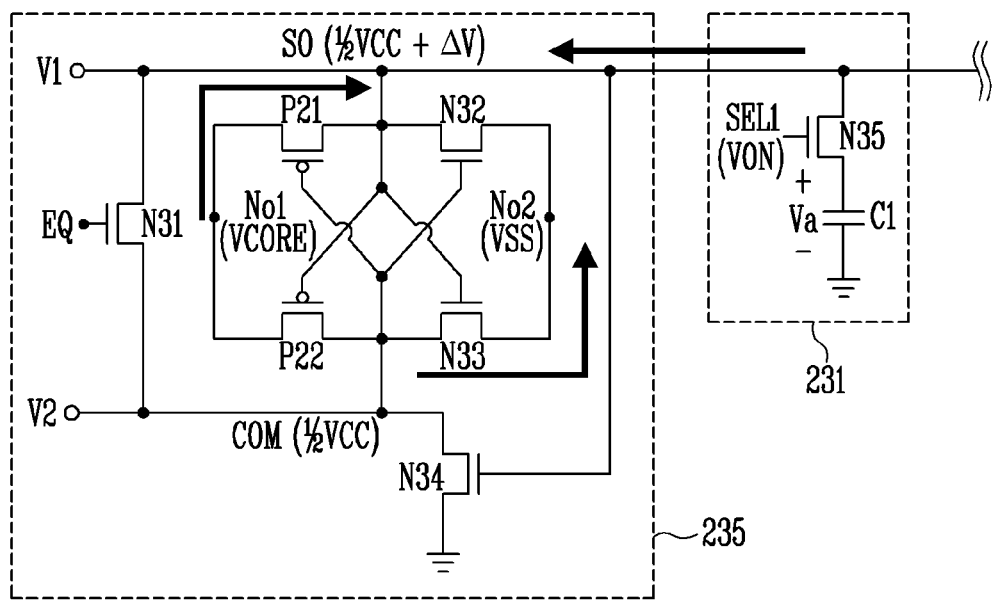
FIGS. 10A and 10B are diagrams for explaining an operation of reading bit data "1" stored in the first storage 231 of FIG. 8.
Figure 10B:
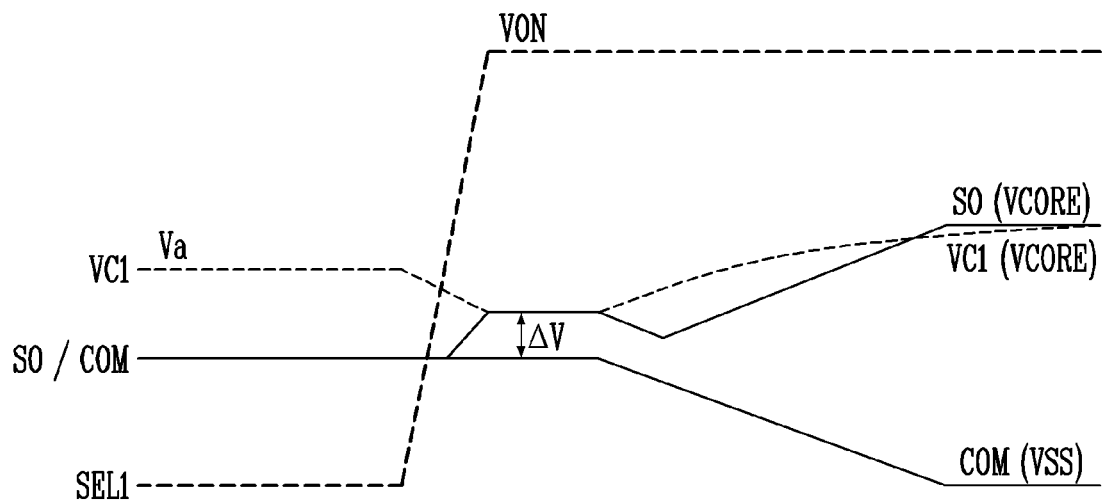

FIGS. 10A and 10B are diagrams for explaining an operation of reading bit data "1" stored in the first storage 231 of FIG. 8.

Referring to FIG. 10A, the first capacitor C1 of the first storage 231 may be charged to a high voltage Va. When the 35-th NMOS transistor N35 is turned on in the state in which the voltages of the sensing node SO and the comparison node COM are set to ½ VCC, the voltage of the sensing node SO may increase to ½ VCC+ΔV. Accordingly, the 33-th NMOS transistor N33 and the 21-st PMOS transistor P21 may be turned on. Thereafter, the voltages of nodes No1 and No2 may be controlled to a supply voltage VCORE and a ground voltage VSS, respectively.

Referring to FIG. 10B, changes in the voltages of the sensing node SO, the comparison node COM, and the first capacitor C1, occurring when the 35-th NMOS transistor N35 is turned on in the state in which the first capacitor C1 of the first storage 231 is charged to the high voltage Va, are illustrated. In FIG. 10B, the voltage of the first capacitor C1 is illustrated as VC1. Initially, the voltage VC1 of the first capacitor C1 may be a high voltage Va. As the voltage of a first select signal SEL1 is increased to the turn-on voltage VON, the 35-th NMOS transistor N35 may be turned on. Accordingly, the voltage VC1 of the first capacitor C1 may decrease, and the voltage of the sensing node SO may slightly increase. A voltage difference ΔV between the sensing node SO and the comparison node COM may be amplified, and thus, the voltage of the sensing node SO may increase to the supply voltage VCORE, and the voltage of the comparison node COM may decrease to the ground voltage VSS. Furthermore, the voltage VC1 of the first capacitor C1 may increase to the supply voltage VCORE.

Figure 11A:
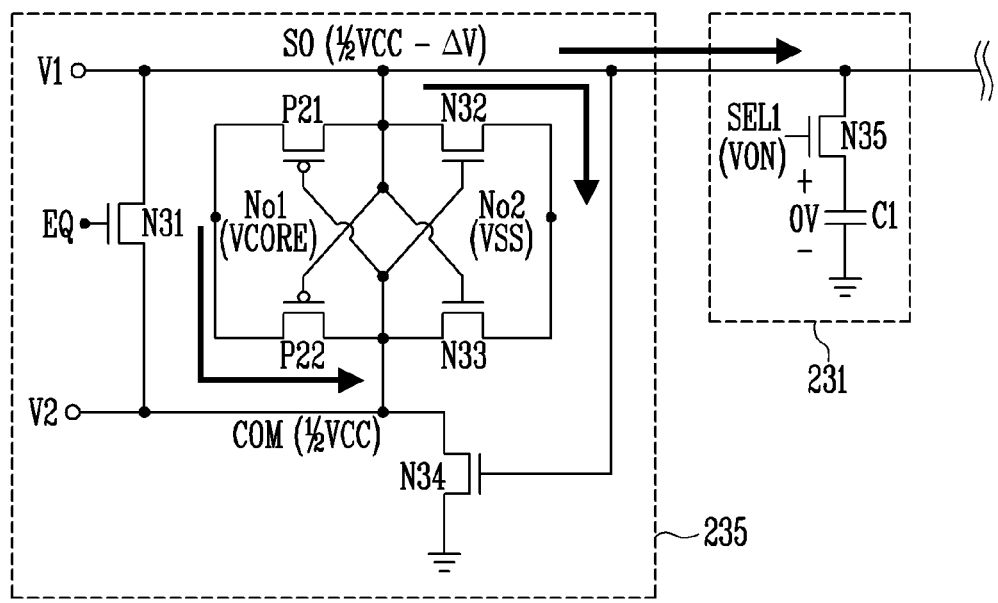
FIGS. 11A and 11B are diagrams for explaining an operation of reading bit data "0" stored in the first storage 231 of FIG. 8.
Figure 11B:
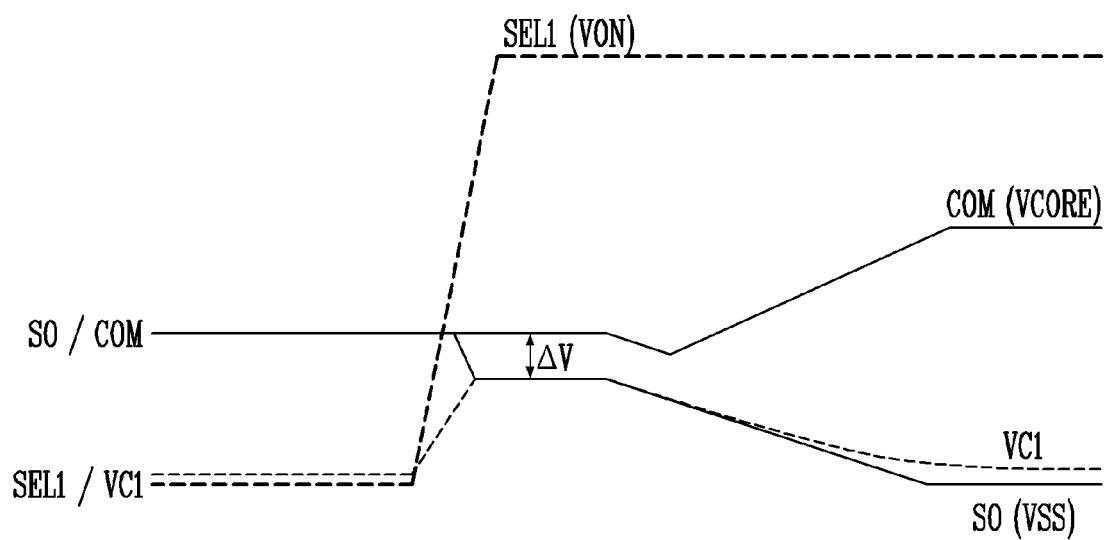

FIGS. 11A and 11B are diagrams for explaining an operation of reading bit data "0" stored in the first storage 231 of FIG. 8.

Referring to FIG. 11A, the first capacitor C1 of the first storage 231 may be discharged to 0 V. When the 35-th NMOS transistor N35 is turned on in the state in which the voltages of the sensing node SO and the comparison node COM are set to ½ VCC, the voltage of the sensing node SO may decrease to ½ VCC-AV. Accordingly, the 32-th NMOS transistor N32 and the 22-nd PMOS transistor P22 may be turned on. Thereafter, the voltages of nodes No1 and No2 may be controlled to a supply voltage VCORE and a ground voltage VSS, respectively.

Referring to FIG. 11B, changes in the voltages of the sensing node SO, the comparison node COM, and the first capacitor C1, occurring when the 31-st NMOS transistor N31 is turned on in the state in which the first capacitor C1 of the first storage 231 is discharged to 0 V, are illustrated. As the voltage of a first select signal SEL1 is increased to the turn-on voltage VON, the 35-th NMOS transistor N35 may be turned on. Accordingly, the voltage VC1 of the first capacitor C1 may increase, and the voltage of the sensing node SO may slightly decrease. A voltage difference ΔV between the sensing node SO and the comparison node COM may be amplified, and thus the voltage of the sensing node SO may decrease to the ground voltage VSS, and the voltage of the comparison node COM may increase to the supply voltage VCORE. Furthermore, the voltage VC1 of the first capacitor C1 may also decrease to the ground voltage VSS.

As illustrated in FIGS. 10B and 11B, after the sensing operation of amplifying the voltage difference ΔV between the sensing node SO and the comparison node COM is performed based on the voltage VC1 of the first capacitor C1, the voltage VC1 of the first capacitor C1 may be recovered to the voltage before sensing. Therefore, even after the sensing operation, the value of the bit data that is stored in the first storage 231 may be maintained.

Figure 12:
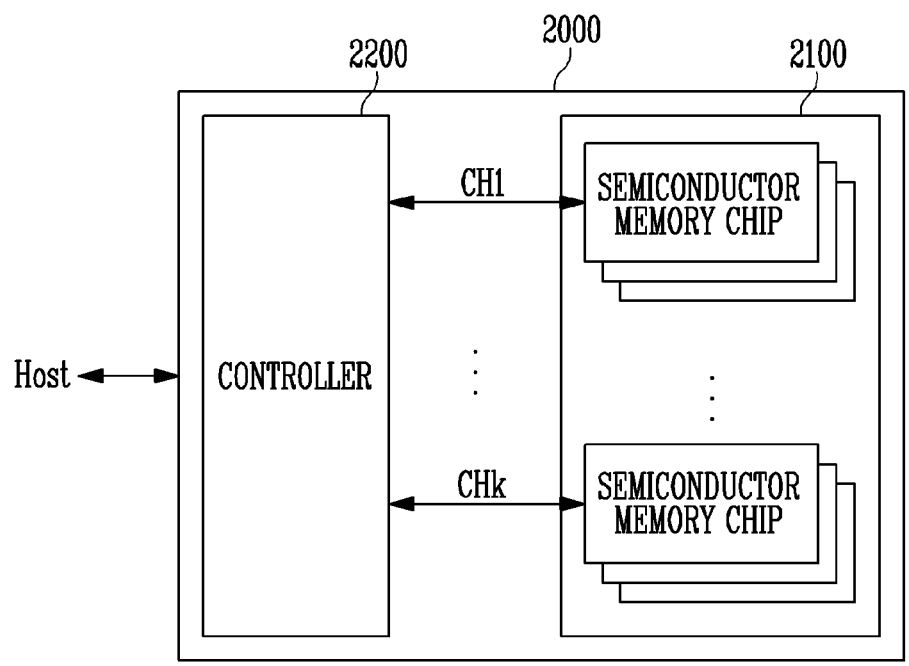
FIG. 12 is a block diagram illustrating an example 2000 of application of a storage device including a semiconductor memory device according to an embodiment of the present disclosure.

FIG. 12 is a block diagram illustrating an example 2000 of application of a storage device including a semiconductor memory device according to an embodiment of the present disclosure.

Referring to FIG. 12, the storage device 2000 may include a semiconductor memory device 2100 and a controller 2200. The semiconductor memory device 2100 may include a plurality of semiconductor memory chips. The semiconductor memory chips may be divided into a plurality of groups.

In FIG. 12, it is illustrated that the plurality of groups communicate with the controller 2200 through first to k-th channels CH1 to CHk, respectively. Each semiconductor memory chip may have the same configuration and operation as the semiconductor memory device 100 described with reference to FIG. 1.

Each group may communicate with the controller 2200 through one common channel. The controller 2200 may control the plurality of semiconductor memory chips of the semiconductor memory device 2100 through the plurality of channels CH1 to CHn.

In FIG. 12, a plurality of semiconductor memory chips are described as being coupled to each channel. However, it will be understood that the storage device 2000 may be modified such that a single semiconductor memory chip is coupled to each channel.

Figure 13:
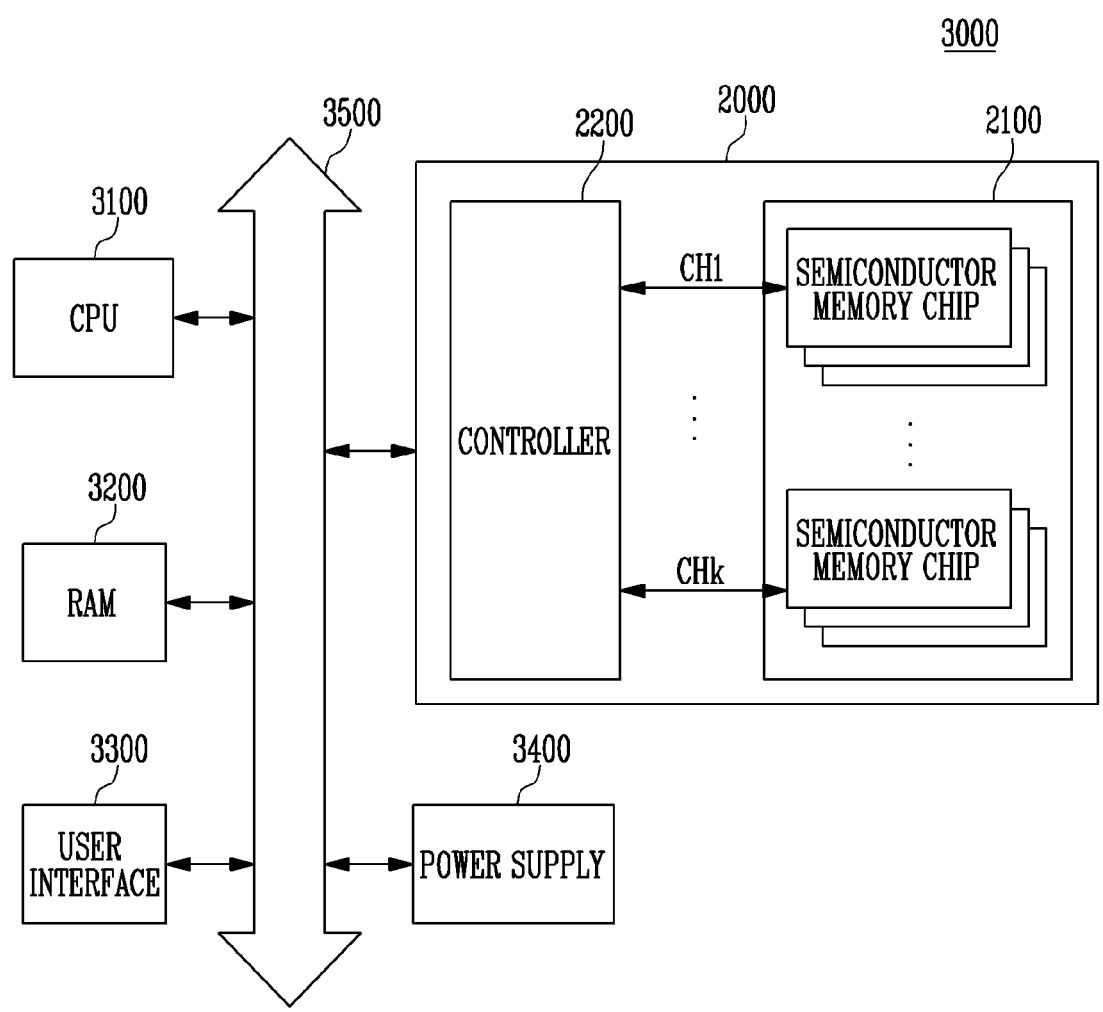
FIG. 13 is a block diagram illustrating a computing system including the storage device described with reference to FIG. 12.

FIG. 13 is a block diagram illustrating a computing system including the storage device described with reference to FIG. 12.

Referring to FIG. 13, a computing system 3000 may include a central processing unit (CPU) 3100, a random access memory (RAM) 3200, a user interface 3300, a power supply 3400, a system bus 3500, and a storage device 2000.

The storage device 2000 may be electrically connected to the CPU 3100, the RAM 3200, the user interface 3300, and the power supply 3400 through the system bus 3500. Data provided through the user interface 3300 or processed by the CPU 3100 may be stored in the storage device 2000.

In FIG. 13, a semiconductor memory device 2100 is illustrated as being coupled to the system bus 3500 through the controller 2200. However, the semiconductor memory device 2100 may be directly coupled to the system bus 3500. Here, a function of the controller 2200 may be performed by the CPU 3100 and the RAM 3200.

The present disclosure may provide a nonvolatile semiconductor memory device in which an area occupied by a read and write circuit is reduced.

What is claimed is:

1. A nonvolatile semiconductor memory device, comprising:
    a memory cell array including a plurality of nonvolatile memory cells;
    a read and write circuit configured to perform a program operation or a read operation on nonvolatile memory cells that are selected from among the plurality of nonvolatile memory cells; and
    a control logic configured to control an operation of the read and write circuit,
    wherein the read and write circuit comprises a plurality of temporary storage circuits each of which comprises at least one capacitor configured to store bit data and a sense amplifier, which is coupled to a sensing node and a comparison node, configured to, based on a voltage charged in one of the at least one capacitor, amplify a voltage difference between the sensing node and the comparison node, thereby converting a voltage of the sensing node to either a supply voltage or a ground voltage, and converting a voltage of the comparison node to the other voltage,
    wherein the read and write circuit comprises a plurality of page buffers coupled to the memory cell array through a plurality of bit lines, respectively,
    wherein each of the plurality of page buffers comprises:
        an internal operating circuit coupled to a corresponding bit line, among the plurality of bit lines; and
        a corresponding temporary storage circuit, among the plurality of temporary storage circuits, coupled to the internal operating circuit,
    wherein each of the plurality of temporary storage circuits further comprises at least one control transistor, and
    wherein the internal operating circuit comprises:
        a first transistor coupled between the corresponding bit line and a first node;
        a second transistor coupled between a supply voltage source and a second node;
        a third transistor coupled between the first node and the second node;
        a fourth transistor coupled between the second node and a third node; and
        a fifth transistor coupled between the first node and the third node, wherein the third node is the sensing node.

2. The nonvolatile semiconductor memory device according to claim 1, wherein the first transistor, the third transistor, and the fifth transistor are NMOS transistors, and the second transistor and the fourth transistor are PMOS transistors.

3. The nonvolatile semiconductor memory device according to claim 2, wherein the internal operating circuit further comprises:
    a sixth transistor coupled to the first node;
    a seventh transistor coupled in series between the sixth transistor and a ground voltage source;
    an eighth transistor coupled between the supply voltage source and the third node; and
    a latch circuit coupled to a gate terminal of the second transistor and to a gate terminal of the seventh transistor.

4. The nonvolatile semiconductor memory device according to claim 3, wherein the sixth transistor and the seventh transistor are NMOS transistors, and the eighth transistor is a PMOS transistor.

5. The nonvolatile semiconductor memory device according to claim 3, wherein the latch circuit comprises:
    a latch;
    a ninth transistor coupled to the latch through a fourth node; and
    a tenth transistor coupled to the latch through a fifth node,
    wherein the fourth node is coupled to the gate terminal of the second transistor and the gate terminal of the seventh transistor.

6. The nonvolatile semiconductor memory device according to claim 5, wherein the internal operating circuit further comprises:
    an eleventh transistor coupled to the ninth and tenth transistors through a sixth node,
    wherein the sixth node is the comparison node.

7. The nonvolatile semiconductor memory device according to claim 6, wherein the temporary storage circuit is coupled to the internal operating circuit through the third node and the sixth node.

8. The nonvolatile semiconductor memory device according to claim 7, wherein the at least one control transistor is coupled to the third node, and the at least one capacitor is coupled between the at least one control transistor and the ground voltage source.

9. The nonvolatile semiconductor memory device according to claim 8, wherein the sense amplifier is coupled to the third node and to the sixth node.

10. The nonvolatile semiconductor memory device according to claim 9, wherein, during a read operation that is performed on the selected nonvolatile memory cells, a voltage corresponding to the third node is charged in the at least one capacitor.

11. The nonvolatile semiconductor memory device according to claim 9, wherein, during a program operation that is performed on the selected nonvolatile memory cells, a voltage that is charged in the at least one capacitor is transferred to the third node.

12. The nonvolatile semiconductor memory device according to claim 9, wherein the sense amplifier comprises:
    a twelfth transistor coupled between the third node and the sixth node;
    thirteenth and fourteenth transistors coupled in series between the third node and the sixth node;
    fifteenth and sixteenth transistors coupled in series between the third node and the sixth node; and
    a seventeenth transistor coupled between the sixth node and the ground voltage source.

13. The nonvolatile semiconductor memory device according to claim 12, wherein:
    the twelfth transistor, the thirteenth transistor, the fourteenth transistor, and the seventeenth transistor are NMOS transistors, and
    the fifteenth transistor and the sixteenth transistor are PMOS transistors.

14. The nonvolatile semiconductor memory device according to claim 13, wherein:
    a control signal received from the control logic is applied to a gate terminal of the twelfth transistor,
    gate terminals of the thirteenth transistor and the fifteenth transistor are coupled to the sixth node, and
    gate terminals of the fourteenth transistor, the sixteenth transistor, and the seventeenth transistor are coupled to the third node.

* * * * *